(12) United States Patent
Dudek

(10) Patent No.: US 10,276,730 B2
(45) Date of Patent: Apr. 30, 2019

(54) STACKED SCHOTTKY DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/812,446

(22) Filed: Nov. 14, 2017

(65) Prior Publication Data

US 2018/0138321 A1 May 17, 2018

(30) Foreign Application Priority Data

Nov. 14, 2016 (DE) ........................ 10 2016 013 542

(51) Int. Cl.
*H01L 21/86* (2006.01)
*H01L 29/872* (2006.01)
(Continued)

(52) U.S. Cl.
CPC .......... *H01L 29/872* (2013.01); *H01L 21/187* (2013.01); *H01L 29/0615* (2013.01);
(Continued)

(58) Field of Classification Search
CPC ... H01L 29/872; H01L 29/0692; H01L 29/20; H01L 29/66143; H01L 29/0615
See application file for complete search history.

(56) References Cited

U.S. PATENT DOCUMENTS 549,655 A 11/1895 Philipsborn
5,017,976 A 5/1991 Sugita
(Continued)

FOREIGN PATENT DOCUMENTS

DE 40 36 222 A1 5/1992
DE 689 18 062 T2 3/1995
(Continued)

OTHER PUBLICATIONS

Josef Lutz et al., "Semiconductor Power Devices", Springer Verlag, 2011, ISBN 978-3-642-11124-2, pp. 238-239.
(Continued)

*Primary Examiner* — Kyoung Lee
*Assistant Examiner* — Christina A Sylvia
(74) *Attorney, Agent, or Firm* — Muncy, Geissler, Olds & Lowe, P.C.

(57) ABSTRACT

A stacked Schottky-diode having a stack with a top side and a bottom side. The stack has at least three semiconductor layers, and a first connection contact layer materially connected to the bottom side of the stack. A second connection contact layer is connected to the top side of the stack, wherein the second connection contact layer forms a Schottky contact. The second connection contact layer is disposed in a partial region of the top side and the second connection contact layer is bounded by edges. The first semiconductor layer, formed as an $n^+$ layer, is placed on the bottom side of the stack and the first semiconductor layer. A second semiconductor layer, formed as an $n^-$ layer, is placed on the first semiconductor layer. A third semiconductor layer formed as a $p^-$ layer is placed on the second semiconductor layer.

17 Claims, 2 Drawing Sheets

(51) Int. Cl.
    *H01L 29/66* (2006.01)
    *H01L 29/06* (2006.01)
    *H01L 29/20* (2006.01)
    *H01L 21/18* (2006.01)

(52) U.S. Cl.
    CPC ...... *H01L 29/0619* (2013.01); *H01L 29/0692* (2013.01); *H01L 29/20* (2013.01); *H01L 29/66143* (2013.01); *H01L 29/66212* (2013.01)

(56) References Cited

U.S. PATENT DOCUMENTS

| | | | |
|---|---|---|---|
| 8,415,671 B2 * | 4/2013 | Zhang | H01L 29/0623 257/66 |
| 8,841,683 B2 * | 9/2014 | Mizukami | H01L 29/872 257/409 |
| 9,941,381 B2 | 4/2018 | Qu et al. | |
| 2009/0289262 A1 * | 11/2009 | Zhang | H01L 29/0615 257/77 |
| 2015/0236104 A1 | 8/2015 | Ogura et al. | |

FOREIGN PATENT DOCUMENTS

| | | | |
|---|---|---|---|
| DE | 102015204138 A1 | 9/2016 | |
| EP | 1 947 700 A2 | 7/2008 | |
| JP | 2005045212 A | 2/2005 | |
| WO | WO 9209099 A1 * | 5/1992 | .......... H01L 21/187 |
| WO | WO0074130 A1 | 12/2000 | |

OTHER PUBLICATIONS

"GaAs Power Devices", Chapter 3, pp. 22-27 by German Ashkinazi, ISGN 965-7094-19-4.

Mori M et al: "A novel soft and fast recovery diode (SFD) with thin p-layer formed by Al—Si electrode", Power Semiconductor Devices and ICS, 1991. ISPSD '91., Proceedings of the 3$^{rd}$ International Symposium on Baltimore, MD, USA Apr. 22-24, 1, New York, N.Y. USA, IEEE, US, Apr. 22, 1991 (Apr. 22, 1991), pp. 113-117, XP010044304, DOI: 10.1109/ISPD.1991.146079, ISBN: 978-0-7803-0009-5.

Hadizad P et al: "High voltage GaAs rectifiers for high frequency, high power density switching applications", Power Modulator Symposium, 1996., Twenty-Second International Boca Raton, FL, USA Jun. 25-27, 1, New York, NY, USA, IEEE, US, Jun. 25, 1996 (Jun. 25, 1996), pp. 35-38, XP010205246, DOI: 10.1109/MODSYM. 1996.564443, ISBN: 978-0-7803-3076-4.

* cited by examiner

STACKED SCHOTTKY DIODE

This nonprovisional application claims priority under 35 U.S.C. § 119(a) to German Patent Application No. 10 2016 013 542.5, which was filed in Germany on Nov. 14, 2016, and which is herein incorporated by reference.

BACKGROUND OF THE INVENTION

Field of the Invention

The invention relates to a stacked Schottky diode.

Description of the Background Art

High-blocking Schottky diodes made of SiC are known from Josef Lutz et al., Semiconductor Power Devices, Springer Verlag, 2011, ISBN 978-3-642-11124-2, p. 238.

A Schottky diode having an epitaxial layer structure comprising GaAs with an $n^+$ substrate and a layer comprising nickel for forming the Schottky contact is known from "GaAs Power Devices," Chapter 3, pp. 22-26 by German Ashkinazi, ISBN 965-7094-19-4.

SUMMARY OF THE INVENTION

It is therefore an object of the invention to provide a device that refines the prior art.

According to an exemplary embodiment of the invention, a stacked Schottky diode is provided which has a stack with a top side and a bottom side.

The stack comprises at least three semiconductor layers and a first connection contact layer, which is materially connected to the bottom side of the stack, and a second connection contact layer connected to the top side of the stack.

The second connection contact layer comprises a metal or a metal compound or is formed of a metal or a metal compound, wherein the second terminal contact layer forms a Schottky contact, and wherein the second connection contact layer is disposed in a partial region of the top side and the second connection contact layer is bounded by edges.

A first semiconductor layer formed as an $n^+$ layer is placed on the bottom side of the stack, wherein the first semiconductor layer has a dopant concentration of at least $10^{19}$ N/cm$^{-3}$ and a layer thickness between 50 μm and 400 μm.

The first semiconductor layer comprises a GaAs compound or is formed of a GaAs compound.

A second semiconductor layer formed as an $n^-$ layer is placed on the first semiconductor layer.

The second semiconductor layer has a dopant concentration between $10^{12}$ and $10^{16}$ N/cm$^{-3}$ and a layer thickness between 10 μm and 300 μm, and comprises a GaAs compound or is formed of a GaAs compound.

A third semiconductor layer, formed as a $p^+$ layer, is placed on the second semiconductor layer.

The third semiconductor layer has a dopant concentration between $10^{12}$ and $10^{16}$ N/cm$^{-3}$ and a layer thickness between 10 nm and 10 μm, and comprises a GaAs compound or is formed of a GaAs compound.

The stack has a plurality of $p^+$ regions, each spaced apart from one another.

The $p^+$ regions are formed as ribs running parallel to the top side of the stack and have a dopant concentration of $5 \cdot 10^{17}$ to $5 \cdot 10^{20}$ N/cm$^{-3}$ and extend from the top side of the stack into the second semiconductor layer.

All edges of the second connection contact layer can run within the $p^+$ regions.

It should be noted that the second connection contact layer can be referred to as the anode and the first connection contact layer as the cathode. In this case, the first connection contact layer forms an ohmic contact and the second connection contact layer a metal-semiconductor junction.

It is understood that further layers can be formed on the connection contact layers in order to bond, for example, the Schottky diode.

An advantage is that the Schottky contact can be completely shielded from penetration of the high electrical field by means of the very thin low-doped p layer as the third semiconductor layer and the $p^+$ regions which are formed at the edges and preferably below the second contact connection layer. For this purpose, the ribs are relatively close together, so that only relatively narrow $n^-$ layer regions remain between adjacent ribs.

As a result, blocking voltages of the Schottky diode can be easily reached in a range between 200 V and 600 V and also above 600 V. Fast switching times can be achieved in conjunction with the effective mass of GaAs substantially smaller in comparison with silicon.

The Schottky diode of the invention is thus particularly suited as a freewheeling diode in the field of power electronics, preferably in the case of switching power supply units and converters.

The second connection contact layer is preferably quadrangular or circular and preferably covers more than 30%, most preferably more than 50% of the area of the semiconductor layer on the top of the stack.

In an embodiment, the stack can be formed monolithically. Monolithic semiconductor structures are fabricated by means of epitaxial production processes such as LPE or MOVPE.

In an embodiment refinement, the three indicated semiconductor layers can be arranged in the indicated sequence and are materially connected to one another.

In an embodiment, the $p^+$ regions are produced by implantation, wherein all regions, except for the rib-shaped regions to be formed, are previously covered by a masking step on the top side. Preferably, the distance between two directly adjacent $p^+$ regions is between 3 μm and 30 μm.

In an embodiment, at least five $p^+$ regions spaced apart from one another are provided. Preferably, the $p^+$ regions are arranged along the edges and below the second connection contact layer and in each case have the same distance to one another. The connection contact layer completely covers all other $p^+$ regions except for the regions arranged along the edges.

In an embodiment, a fourth semiconductor layer, formed as an $n^-$ layer, is placed on the third semiconductor layer, wherein the fourth semiconductor layer has a dopant concentration between of $10^{12}$ N/cm$^{-3}$ and $10^{16}$ N/cm$^{-3}$ and a layer thickness between 0.005 μm and 10 μm and comprises a GaAs compound or is formed of a GaAs compound. The fourth semiconductor layer is formed on the top side of the stack and the $p^+$ regions extend through the fourth semiconductor layer.

In an embodiment, the second contact layer covers the top side of the stack only partially. Preferably, the first contact layer covers the bottom side of the stack completely or except for a narrow edge region of less than 1 mm.

In an embodiment, the stacked layer structure, formed of the $p^-$ layer, the $n^-$ layer, and the $n^+$ layer, has a semiconductor bond formed between the $n^-$ layer and the $p^-$ layer. It should be noted that the term 'semiconductor bond' can be used synonymously with the term 'wafer bond'. The layer structure has a first partial stack, comprising the p⁻ layer, and a second partial stack, comprising the n⁺ layer and the n⁻ layer. The first partial stack and the second partial stack are each formed monolithically.

The p⁻ layer can have a doping of less than $10^{13}$ N/cm⁻³ or a doping between $10^{13}$ N/cm⁻³ and $10^{15}$ N/cm⁻³. In an embodiment, the p⁻ layer is thinned before or after the bonding by a grinding process to a thickness between 10 μm and 300 μm.

In an embodiment, a first partial stack is provided, wherein the first partial stack comprises the p⁻ layer, and further a second stack is provided, wherein the second partial stack comprises the n⁻ layer and the n⁺ layer, and the first partial stack is connected to the second stack by a wafer bonding process.

In an embodiment, the second stack is formed in which the n⁻ layer can be formed proceeding from an n⁻ substrate; in this case the n⁻ substrate or the n⁻ layer will be or is connected to the second stack by a wafer bonding process. In a further process step, the n⁻ substrate or the n⁻ layer is thinned to the desired thickness. For example, the thickness of the n⁻ layer is within a range between 50 μm and 250 μm. The doping of the n⁻ layer can be in a range between $10^{13}$ N/cm⁻³ and $10^{15}$ N/cm⁻³. An advantage of the wafer bonding is that thick n⁻ layers can be easily produced. A longer deposition process during epitaxy is not necessary as a result. The number of stacking errors can also be reduced by means of the bonding.

In an embodiment, the n⁻ layer has a doping greater than $10^{10}$ N/cm⁻³ and less than $10^{13}$ N/cm⁻³. Because the doping is extremely low, the n⁻ layer can also be understood as an intrinsic layer.

In an embodiment, after the thinning of the n⁻ substrate or the n⁻ layer by epitaxy or high-dose implantation, the n⁺ layer is produced on the n⁻ substrate or the n⁻ layer in a range between $10^{18}$ N/cm⁻³ and less than $5 \times 10^{19}$ N/cm⁻³. The thinning of the n⁻ substrate or the n⁻ layer occurs for example by means of a CMP step, i.e., by means of chemical mechanical polishing.

In an embodiment, an auxiliary layer is deposited on the front side of the diode structure. The rear side of the diode structure can then be thinned and placed on a carrier. In an embodiment, the front side is then removed.

In an embodiment, the surface of the n⁺ layer and the surface of the p⁻ layer are metallized in order to form and electrically connect the Schottky diode. Preferably, the cathode of the semiconductor diode is materially connected to a base formed as a heat sink after the metallization. In other words, the anode is formed on the surface of the diode on the p⁻ layer.

Tests have shown that different blocking voltages can be achieved with specific combinations of a p⁻ intermediate layer and n⁻ layer.

In a first embodiment, the p⁻ intermediate layer comprises: a thickness between 10 μm and 25 μm and a thickness between 40 μm and 90 μm for the n⁻ layer results in a blocking voltage of about 900 V.

In a second embodiment, the p– intermediate layer comprises: a thickness between 25 μm and 35 μm and a thickness between 40 μm and 70 μm for the n– layer results in a blocking voltage of about 1200 V.

In a third embodiment, the p⁻ intermediate layer comprises: a thickness between 35 μm and 50 μm and a thickness between 70 μm and 150 μm for the n⁻ layer results in a blocking voltage of about 1500 V.

The diodes described above in the first to third embodiments can be also be designated as punch-through diodes in regard to the formation of the space charge regions.

In a fourth embodiment, the p⁻ intermediate layer comprises: a thickness between 10 μm and 25 μm and a thickness between 60 μm and 110 μm for the n⁻ layer.

In a fifth embodiment, the p⁻ intermediate layer comprises: a thickness between 10 μm and 25 μm and a thickness between 70 μm and 140 μm for the n⁻ layer.

In a sixth embodiment, the p⁻ intermediate layer comprises: a thickness between 35 μm and 50 μm and a thickness between 80 μm and 200 μm for the n⁻ layer.

The diodes described above in the fourth to sixth embodiments can also be designated as "non-reach-through" diodes in regard to the formation of space charge regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
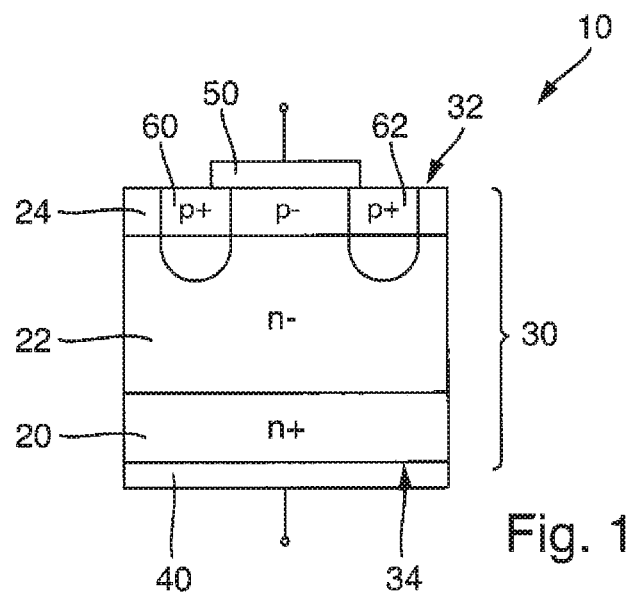
FIG. 1 shows a schematic view of an embodiment of the invention of a stacked Schottky diode.

The diagram in FIG. 1 shows a view of a first embodiment, a stacked Schottky diode 10 having a stack 30 having at least three semiconductor layers 20, 22, 24, with a top side 32 and a bottom side 34, a first connection contact layer 40 materially connected to the bottom side 34 of the stack 30 and a metallic second connection contact layer 50, materially connected to a partial area of top side 32 of the stack, for forming a Schottky contact.

First semiconductor layer 20 of stack 30 is placed as an n⁺ layer on bottom side 34 of stack 30 and has a dopant concentration of at least $10^{19}$ N/cm⁻³ and a layer thickness between 50 μm and 400 μm.

Second semiconductor layer 22 of stack 30 is placed on first semiconductor layer 20 and is materially connected to first semiconductor layer 20.

Second semiconductor layer 22 is formed as an n⁻ layer and has a dopant concentration in a range of $10^{12}$ to $10^{16}$ cm⁻³ and a layer thickness of 10 μm to 300 μm.

Third semiconductor layer 24 of stack 30 is formed as a p⁻ layer and is materially connected to second semiconductor layer 22. Third semiconductor layer 24 has a dopant concentration in a range of $10^{12}$-$10^{16}$ cm⁻³ and a layer thickness of 0.01 μm to 10 μm.

All three semiconductor layers 20, 22, 24 comprise a GaAs compound.

Stack 30 additionally has two $p^+$ regions 60, 62. The two $p^+$ regions 60, 62 each have a dopant concentration of $5·10^{18}$ to $5·10^{20}$ cm$^{-3}$ and are formed as ribs spaced apart from one another, wherein each $p^+$ region 60, 62, therefore each rib, extends in a direction perpendicular to top side 32 of stack 30 from top side 32 of stack 30 into n$^-$ layer 22 and forms a strip in a first direction parallel to top side 32 of stack 30.

In order to form the Schottky contact, second connection contact layer 50 covers a part of top side 32 of stack 30, wherein the part comprises a first surface region, located between the two $p^+$ regions 60, 62, and in each case only one partial region, adjacent to the first surface region, of the two $p^+$ regions, and second connection contact layer 50 is materially connected to third semiconductor layer 24.

Figure 2:
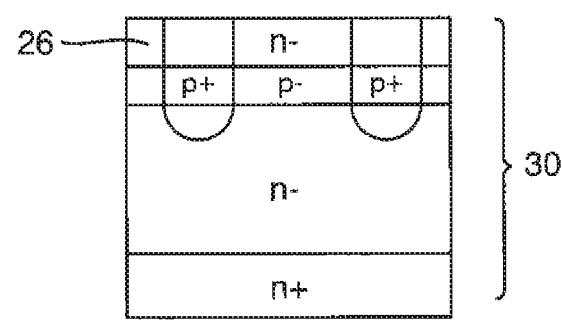
FIG. 2 shows a schematic view of an embodiment of the invention of a stack of a stacked Schottky diode.

A further embodiment of a stack 30 of a Schottky diode 10 of the invention is shown in the diagram of FIG. 2. Only the differences from the illustration in FIG. 1 will be explained below.

Stack 30 has a fourth semiconductor layer 26. Fourth semiconductor layer 26 is formed as an n– layer with a dopant concentration of 1012-1016 cm-3 and a layer thickness of 0.005 µm to 10 µm and also comprises a GaAs compound.

The n$^-$ layer is materially connected to the underlying p$^-$ layer and forms the top side of the stack. The $p^+$ region extends in each case through the n$^-$ layer.

Figure 3:
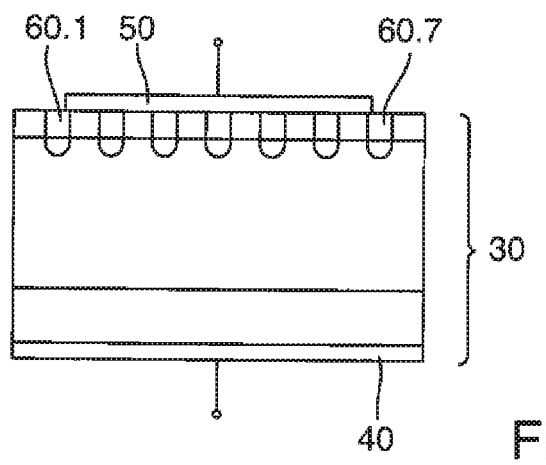
FIG. 3 shows a schematic view of an embodiment of the invention of a stacked Schottky diode.
Figure 4:
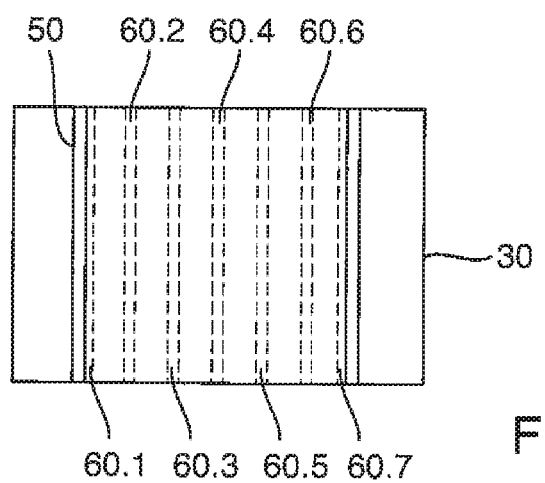
FIG. 4 shows a top view of an embodiment of the Schottky diode of the invention in FIG. 3.

A further embodiment of a Schottky diode 10 of the invention is shown as a side view or as a top view in the diagrams in FIGS. 3 and 4, respectively. Only the differences from the illustration in FIG. 1 will be explained below.

The Schottky diode has seven rib-shaped $p^+$ regions 60.1 to 60.7 spaced apart from one another. The part of surface 32, which part is materially connected to second connection contact layer 50 in order to form a Schottky contact, extends from first $p^+$ region 60.1 up to seventh $p^+$ region 60.7, wherein first $p^+$ region 60.1 and seventh $p^+$ region 60.7 are each covered only partially by the metal layer.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked Schottky diode comprising:
    a stack with a top side and a bottom side, the stack comprising at least three semiconductor layers;
    a first connection contact layer that is materially connected to the bottom side of the stack; and
    a second connection contact layer that is connected to the top side of the stack, the second connection contact layer comprises a metal or a metal compound and forms a Schottky contact, the second connection contact layer disposed in a partial region of the top side and the second connection contact layer is bounded by edges;
    a first semiconductor layer formed as an n$^+$ layer, is placed on the bottom side of the stack, the first semiconductor layer having a dopant concentration of at least $10^{19}$ N/cm$^{-3}$ and a layer thickness between 50 µm and 400 µm, the first semiconductor layer comprising a GaAs compound;
    a second semiconductor layer formed as an n$^-$ layer, is placed on the first semiconductor layer, the second semiconductor layer having a dopant concentration between $10^{12}$ and $10^{16}$ N/cm$^{-3}$ and a layer thickness between 10 µm and 300 µm, the second semiconductor layer comprising a GaAs compound; and
    a third semiconductor layer formed as a p$^-$ layer, is placed on the second semiconductor layer, the third semiconductor layer having a dopant concentration between $10^{12}$ and $10^{16}$ N/cm$^{-3}$ and a layer thickness between 10 nm and 10 µm, the third semiconductor layer comprising a GaAs compound,
    wherein the stack has a plurality of $p^+$ regions, each spaced apart from one another,
    wherein the $p^+$ regions are formed as ribs running parallel to the top side of the stack,
    wherein the $p^+$ regions have a dopant concentration of $5·10^{18}$ to $5·10^{20}$ N/cm$^{-3}$,
    wherein the $p^+$ regions extend from the top side of the stack into the second semiconductor layer,
    wherein all edges of the second connection contact layer run within $p^+$ regions, and
    wherein the third semiconductor layer extends across the second semiconductor layer and is in direct contact with an entirety of a top surface of the second semiconductor layer.

2. The Schottky diode according to claim 1, wherein the three semiconductor layers are arranged in the given sequence and are materially connected to one another.

3. The Schottky diode according to claim 1, wherein a fourth semiconductor layer, formed as an n$^-$ layer, is placed on the third semiconductor layer and the fourth semiconductor layer has a dopant concentration between of $10^{12}$ N/cm$^{-3}$ and $10^{16}$ N/cm$^{-3}$ and a layer thickness between 0.005 µm and 10 µm, and wherein the fourth semiconductor layer comprises a GaAs compound, and wherein the fourth semiconductor layer is formed on the top side of the stack and the $p^+$ regions extend through the fourth semiconductor layer.

4. The Schottky diode according to claim 1, wherein the stack is formed monolithically.

5. The Schottky diode according to claim 1, wherein the $p^+$ regions are produced via a mask and ion implantation.

6. The Schottky diode according to claim 1, wherein $p^+$ regions have distances between them in a range between 3 µm to 30 µm.

7. The Schottky diode according to claim 1, wherein the Schottky diode has at least five $p^+$ regions spaced apart from one another.

8. The Schottky diode according to claim 1, wherein the $p^+$ regions are arranged along the edges and below the second connection contact layer, and wherein the ribs each have the same distance to one another.

9. The Schottky diode according to claim 1, wherein the second contact layer covers the top side of the stack only partially and/or the first contact layer covers the bottom side of the stack completely or except for a narrow edge region of less than 1 mm.

10. The Schottky diode according to claim 1, wherein a first partial stack is provided, wherein the first partial stack comprises the p$^-$ layer, wherein a second stack is provided, wherein the second partial stack comprises a n$^-$ layer and n$^+$ layer, and wherein the first partial stack is connected to the second stack by a wafer bonding process.

11. The Schottky diode according to claim 1, wherein the $p^+$ regions extend through the third semiconductor layer into the second semiconductor layer.

12. A stacked Schottky diode comprising:
    a stack with a top side and a bottom side, the stack comprising at least three semiconductor layers;

a first connection contact layer that is materially connected to the bottom side of the stack; and
a second connection contact layer that is connected to the top side of the stack, the second connection contact layer comprises a metal or a metal compound and forms a Schottky contact, the second connection contact layer disposed in a partial region of the top side and the second connection contact layer is bounded by edges;
a first semiconductor layer formed as an $n^+$ layer, is placed on the bottom side of the stack, the first semiconductor layer having a dopant concentration of at least $10^{19}$ $N/cm^{-3}$ and a layer thickness between 50 μm and 400 μm, the first semiconductor layer comprising a GaAs compound;
a second semiconductor layer formed as an $n^-$ layer, is placed on the first semiconductor layer, the second semiconductor layer having a dopant concentration between $10^{12}$ and $10^{16}$ $N/cm^{-3}$ and a layer thickness between 10 μm and 300 μm, the second semiconductor layer comprising a GaAs compound; and
a third semiconductor layer formed as a $p^-$ layer, is placed on the second semiconductor layer, the third semiconductor layer having a dopant concentration between $10^{12}$ and $10^{16}$ $N/cm^{-3}$ and a layer thickness between 10 nm and 10 μm, the third semiconductor layer comprising a GaAs compound,
wherein the stack has a plurality of $p^+$ regions, each spaced apart from one another,
wherein the $p^+$ regions are formed as ribs running parallel to the top side of the stack,
wherein the $p^+$ regions have a dopant concentration of $5 \cdot 10^{18}$ to $5 \cdot 10^{20}$ $N/cm^{-3}$,
wherein the $p^+$ regions extend from the top side of the stack into the second semiconductor layer,
wherein all edges of the second connection contact layer run within $p^+$ regions,
wherein the second semiconductor layer directly contacts and is disposed entirely above a top surface of the first semiconductor layer, and
wherein the third semiconductor layer is directly above and abutting the second semiconductor layer.

13. The Schottky diode according to claim 12, wherein the $p^+$ regions extend through the third semiconductor layer into the second semiconductor layer.

14. A stacked Schottky diode comprising:
a stack with a top side and a bottom side, the stack comprising at least three semiconductor layers;
a first connection contact layer that is materially connected to the bottom side of the stack; and
a second connection contact layer that is connected to the top side of the stack, the second connection contact layer comprises a metal or a metal compound and forms a Schottky contact, the second connection contact layer disposed in a partial region of the top side and the second connection contact layer is bounded by edges;
a first semiconductor layer formed as an $n^+$ layer, is placed on the bottom side of the stack, the first semiconductor layer having a dopant concentration of at least $10^{19}$ $N/cm^{-3}$ and a layer thickness between 50 μm and 400 μm, the first semiconductor layer comprising a GaAs compound;
a second semiconductor layer formed as an $n^-$ layer, is placed on the first semiconductor layer, the second semiconductor layer having a dopant concentration between $10^{12}$ and $10^{16}$ $N/cm^{-3}$ and a layer thickness between 10 μm and 300 μm, the second semiconductor layer comprising a GaAs compound; and
a third semiconductor layer formed as a $p^-$ layer, is placed on the second semiconductor layer, the third semiconductor layer having a dopant concentration between $10^{12}$ and $10^{16}$ $N/cm^{-3}$ and a layer thickness between 10 nm and 10 μm, the third semiconductor layer comprising a GaAs compound,
wherein the stack has a plurality of $p^+$ regions, each spaced apart from one another,
wherein the $p^+$ regions are formed as ribs running parallel to the top side of the stack,
wherein the $p^+$ regions have a dopant concentration of $5 \cdot 10^{18}$ to $5 \cdot 10^{20}$ $N/cm^{-3}$,
wherein the $p^+$ regions extend from the top side of the stack into the second semiconductor layer,
wherein all edges of the second connection contact layer run within $p^+$ regions, and
wherein a top surface of the $p^+$ regions is coplanar with a top surface of the third semiconductor layer.

15. A stacked Schottky diode comprising:
a stack with a top side and a bottom side, the stack comprising:
a first semiconductor layer, formed as an $n^+$ layer, disposed on the bottom side of the stack, the first semiconductor layer comprising a GaAs compound;
a second semiconductor layer, formed as an $n^-$ layer, disposed on and above the first semiconductor layer, the second semiconductor layer comprising a GaAs compound; and
a third semiconductor layer, formed as a $p^-$ layer, disposed on and above the second semiconductor layer, the third semiconductor layer comprising a GaAs compound;
a first connection contact layer that is materially connected to the bottom side of the stack; and
a second connection contact layer that is connected to the top side of the stack, the second connection contact layer comprises a metal or a metal compound and forms a Schottky contact, the second connection contact layer disposed only in a partial region of the top side,
wherein the stack has a plurality of $p^+$ regions, each spaced apart from one another, and
wherein the $p^+$ regions are formed as ribs running parallel to the top side of the stack.

16. The Schottky diode according to claim 15, wherein the third semiconductor layer is disposed on and above the second semiconductor layer.

17. The Schottky diode according to claim 15, wherein the second semiconductor layer directly contacts and is disposed entirely above a top surface of the first semiconductor layer, and
wherein the third semiconductor layer directly contacts and is disposed entirely above a top surface of the second semiconductor layer.

* * * * *